US010004156B2

United States Patent
Chiu et al.

(10) Patent No.: US 10,004,156 B2
(45) Date of Patent: Jun. 19, 2018

(54) HEAT RADIATION FIN STRUCTURE

(71) Applicant: ASIA VITAL COMPONENTS CO., LTD., New Taipei (TW)

(72) Inventors: Jung-Yi Chiu, New Taipei (TW); Fu-Kuei Chang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days. days.

(21) Appl. No.: 15/275,493

(22) Filed: Sep. 26, 2016

(65) Prior Publication Data

US 2018/0092242 A1    Mar. 29, 2018

(51) Int. Cl.
| F28F 7/00 | (2006.01) |
| H05K 7/20 | (2006.01) |
| F28F 13/06 | (2006.01) |
| F28F 3/08 | (2006.01) |

(52) U.S. Cl.
CPC ........... *H05K 7/20154* (2013.01); *F28F 3/08* (2013.01); *F28F 13/06* (2013.01); *H05K 7/20409* (2013.01)

(58) Field of Classification Search
CPC ... H05K 7/20154; H05K 7/20409; F28F 3/08; F28F 13/06
USPC ......................................................... 165/80.3
See application file for complete search history.

(56) References Cited

U.S. PATENT DOCUMENTS

| 3,406,753 A * | 10/1968 | Habdas ................ F25B 21/02 136/204 |
| 4,897,626 A * | 1/1990 | Fitter .................. H01F 17/04 336/175 |
| 5,502,619 A * | 3/1996 | Wang ................... H01L 23/467 257/E23.099 |
| 6,575,231 B1 * | 6/2003 | Wu ...................... H01L 23/467 165/121 |
| 7,249,626 B2 * | 7/2007 | Hao .................... F28D 15/0266 165/104.33 |
| 7,478,668 B2 * | 1/2009 | Chen .................. H01L 23/427 165/104.33 |
| 2002/0023737 A1 * | 2/2002 | Hao ........................ F28F 3/02 165/121 |
| 2002/0144809 A1 * | 10/2002 | Siu ........................ B21D 53/04 165/185 |
| 2004/0150956 A1 * | 8/2004 | Conte ................. H01L 23/3677 361/709 |
| 2005/0224214 A1 * | 10/2005 | Zeighami ............. F24F 13/222 165/104.21 |

(Continued)

*Primary Examiner* — Justin Jonaitis
(74) *Attorney, Agent, or Firm* — Jackson IPG PLLC; Demian K. Jackson

(57) ABSTRACT

A heat radiation fin structure includes a main body, composed of a plurality of stacked laminations, and each the lamination has at least one heat dissipation section and at least one heat absorption section. The heat dissipation section is composed of a plurality of extended portions, which are outwardly extended from the heat absorption section. Two adjacent laminations are crossly stacked or arranged, such that a plurality of passages are formed in the extended portions, and the heat dissipation section is connected to the heat absorption section. With these arrangements, the heat radiation fin structure can generate a vortex flow when a cooling air flow is blown through the heat radiation fins and further to achieve greatly improved heat dissipation efficiency.

1 Claim, 9 Drawing Sheets

(56) References Cited

U.S. PATENT DOCUMENTS

| | | | |
|---|---|---|---|
| 2007/0131383 A1* | 6/2007 | Hattori | B01D 46/10 165/11.2 |
| 2016/0005902 A1* | 1/2016 | Tung | H01L 31/052 136/255 |
| 2016/0163451 A1* | 6/2016 | Wang | H01F 41/042 336/192 |

* cited by examiner

HEAT RADIATION FIN STRUCTURE

FIELD OF THE INVENTION

The present invention relates to a heat radiation fin structure, and more specifically, to a heat radiation fin structure that can generate a vortex flow when a cooling air flow is blown through the heat radiation fins, so as to greatly improve heat dissipation efficiency.

BACKGROUND OF THE INVENTION

The current available computation units of an electronic device generate heat in operation, so heat dissipation devices, such as heat spreaders, vapor chambers, heat pipes, or water cooling devices, are widely used to remove the heat in the electronic device. Among them, the heat spreader is the most widely used for removing the heat produced in the electronic device. The heat spreader uses a plurality of heat radiation fins to increase an area of heat dissipation, so as to improve heat dissipation efficiency. Normally, the heat spreader is used with a cooling fan, allowing a cooling air flow is forcedly blown to a portion, the heat radiation fins located, of the heat spreader to dissipate the heat. By doing so, the cooling air flow is directed to blow to the heated heat radiation fins, enabling the heat is diffuse from the heat radiation fins, so as to achieve heat dissipation effect.

The heat radiation fins of the heat spreader are parallelly arranged, and space among the heat radiation fins are formed a plurality of air flow passages. When the cooling air flow is blown through the heated heat radiation fins, the heat cannot be effectively removed from the heat radiation fins with each the heat radiation fin having a smooth surface or the narrow air flow passages.

It is therefore tried by the inventor to develop an improved heat radiation fin structure that can have directed cooling to enhance heat dissipation effect to overcome the drawbacks and problems in the conventional heat dissipation device.

SUMMARY OF THE INVENTION

To solve the above and other problems, a primary object of the present invention is to provide a heat radiation fin structure that can generate a vortex flow when a cooling air flow is flown through the heat radiation fins, so as to greatly improve heat dissipation efficiency.

To achieve the above and other objects, the heat radiation fin structure according to the present invention includes a main body, composed of a plurality of stacked laminations, and each the lamination has at least one heat dissipation section and at least one heat absorption section. The heat dissipation section is composed of a plurality of extended portions, which are outwardly extended from the heat absorption section. Two adjacent laminations are crossly stacked or arranged, such that a plurality of passages are formed in the extended portions, and the heat dissipation section is connected to the heat absorption section.

With these arrangements, the heat radiation fin structure can generate a vortex flow when the cooling air flow is blown through the heat radiation fins, so as to greatly improve heat dissipation efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
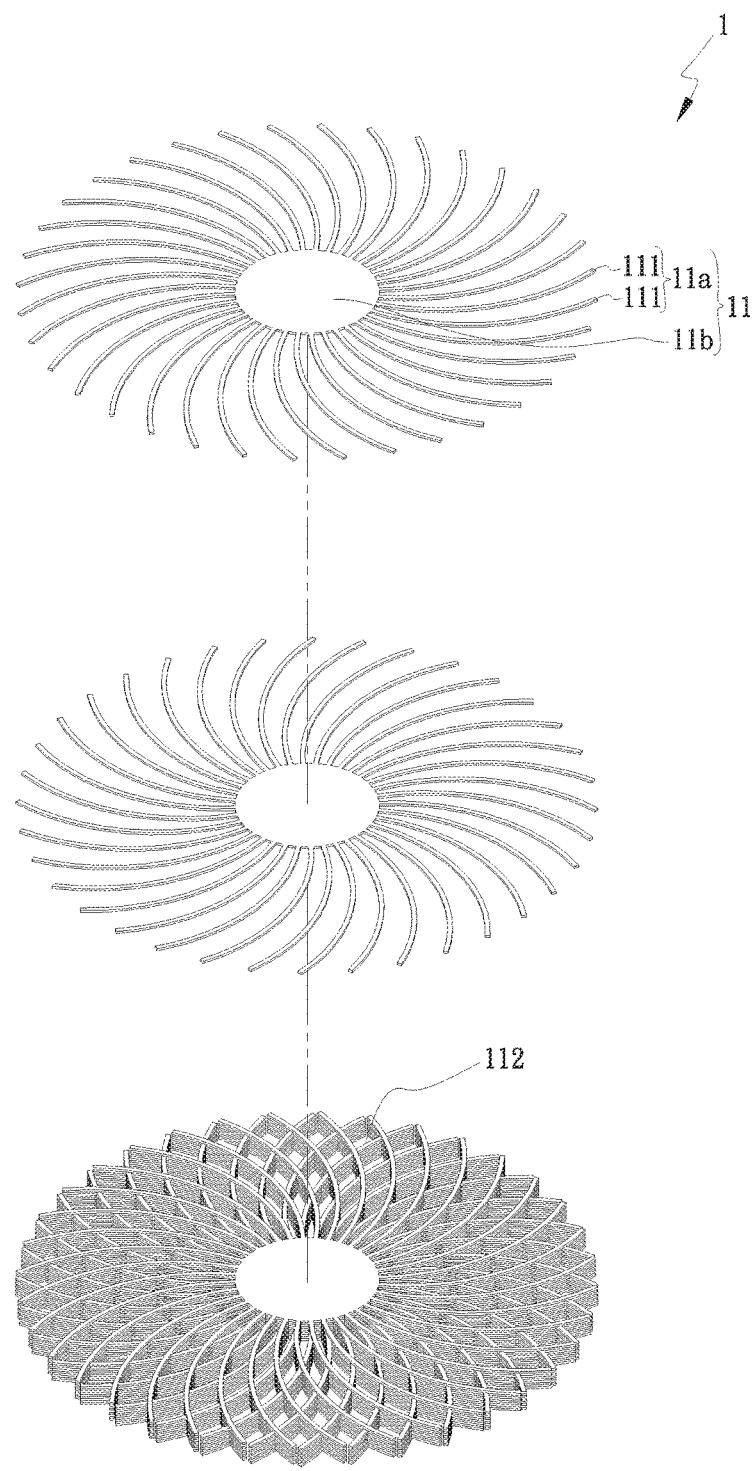
FIG. 1 is an exploded perspective view of a heat radiation fin structure according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
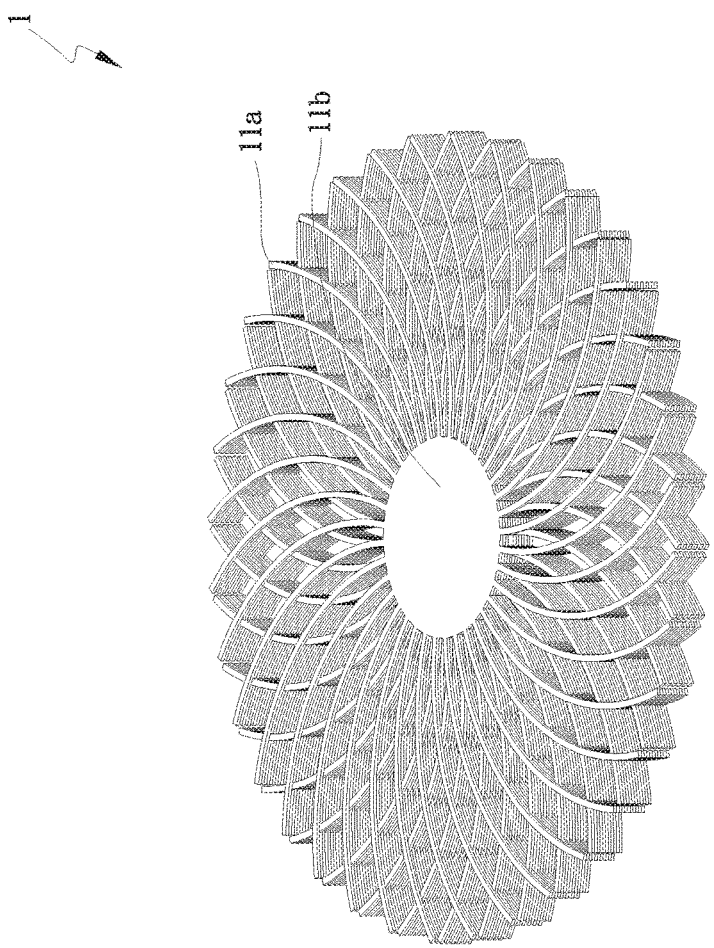
FIG. 2 is an assembled perspective view of FIG. 1.

Please refer to FIGS. 1 and 2, which are exploded and assembled perspective views, respectively, of a heat radiation fin structure according to a first embodiment of the present invention. As shown, the heat radiation fin structure includes a main body 1.

The main body 1 is composed of a plurality of stacked laminations 11, and each the lamination 11 has at least one heat dissipation section 11a and at least one heat absorption section 11b. The heat dissipation section 11a is composed of a plurality of extended portions 111, which are outwardly extended from the heat absorption section 11b. Two adjacent laminations 11 are crossly stacked or arranged, such that a plurality of passages 112 are formed in the extended portions 111, and the heat dissipation section 11b is connected to the heat absorption section 11a.

The main body 1 is a main body of a heat spreader. The extended portions 111 of the laminations 11 are radially clockwisely or counterclockwisely extended, and two adjacent laminations 11 are stacked, such that the laminations are stacked in a clockwise and counterclockwise alternate way.

The heat absorption section 11b is used for contacting with a heat source and transferring heat produce by the heat source. The heat is absorbed by the heat absorption section 11b and transferred to the extended portions 111 of the heat dissipation section 11a to diffuse. With these extended portions of the laminations 11, the heat radiation fin structure can generate a vortex flow when a cooling air flow 2 is blown through the heat radiation fins, so as to greatly improve heat dissipation efficiency.

Figure 3:
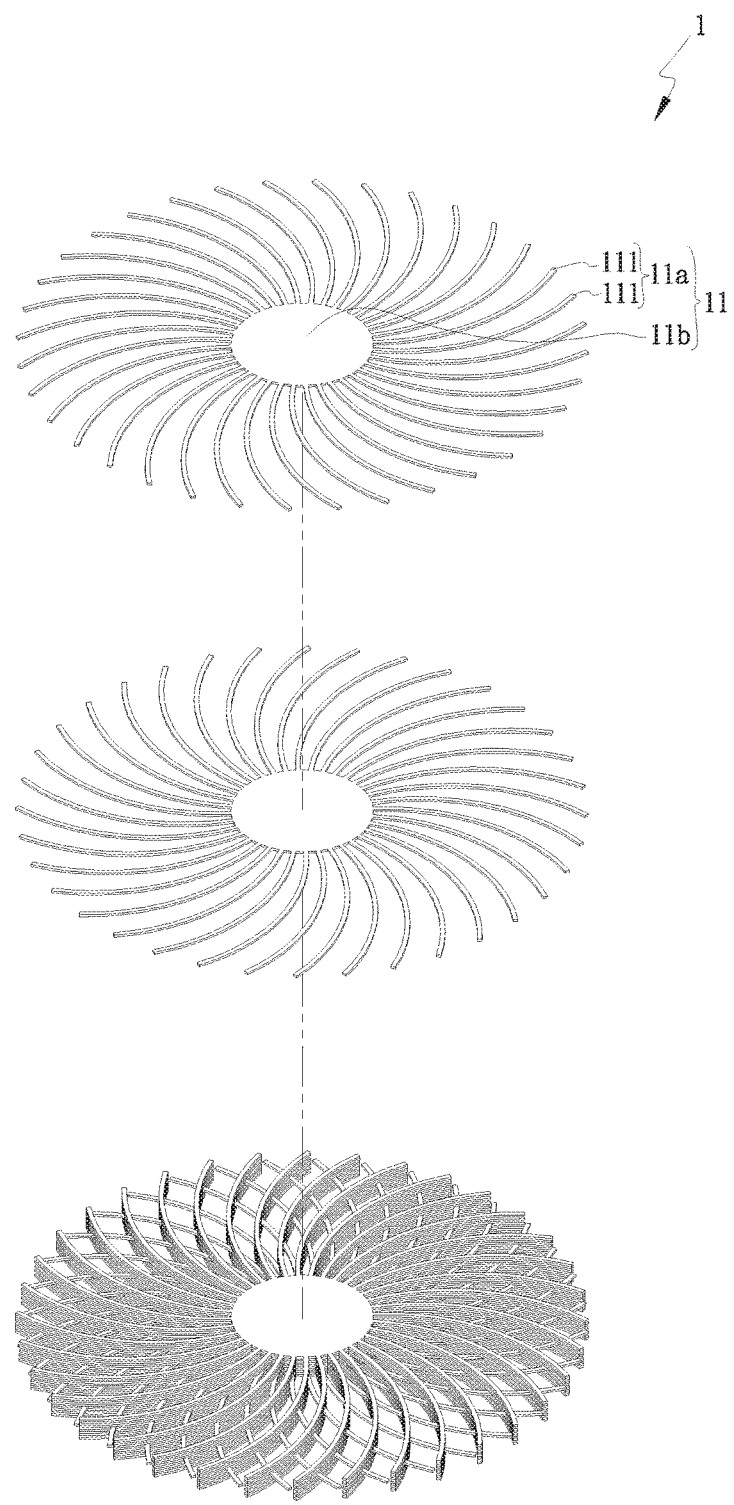
FIG. 3 an exploded perspective view of the heat radiation fin structure according to a second embodiment of the present invention.
Figure 4:
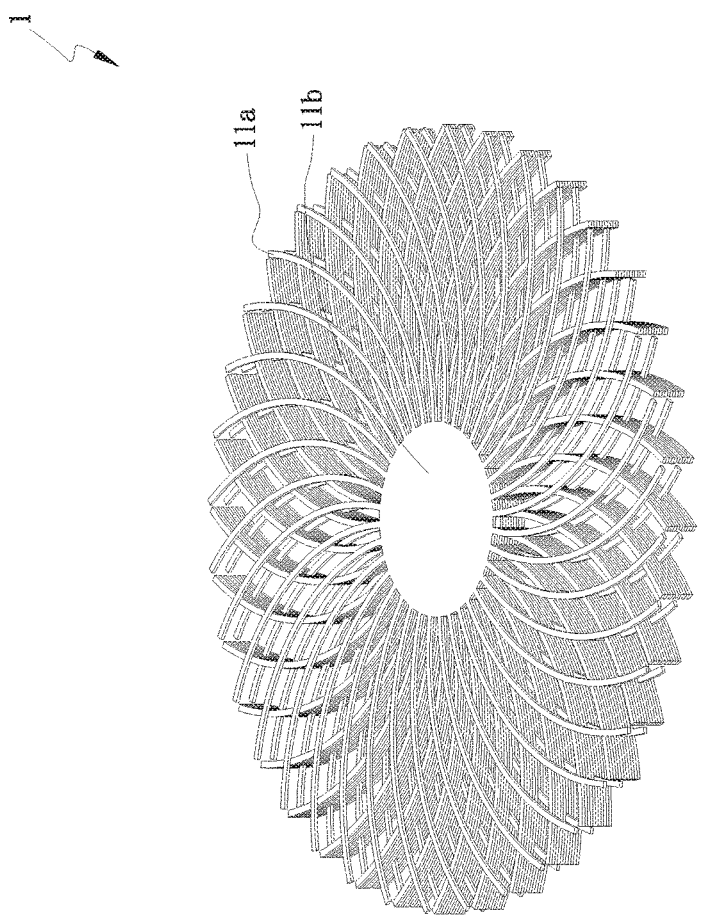
FIG. 4 is an assembled perspective view of FIG. 3.

Please refer to FIGS. 3 and 4, which are exploded and assembled perspective views, respectively, of the heat radiation fin structure according to a second embodiment of the present invention. The second embodiment of the heat radiation fin structure is generally structurally similar to the first embodiment except that, in this second embodiment, one lamination 11, which has a plurality of counterclockwisely extended portions 111, is stacked between some laminations 11, which have a plurality of clockwisely extended portions 111. With these crossly arrangements, the heat radiation fin structure can have increased heat dissipation effect through the cooling air flow 2 blown through the heat radiation fins.

Figure 5:
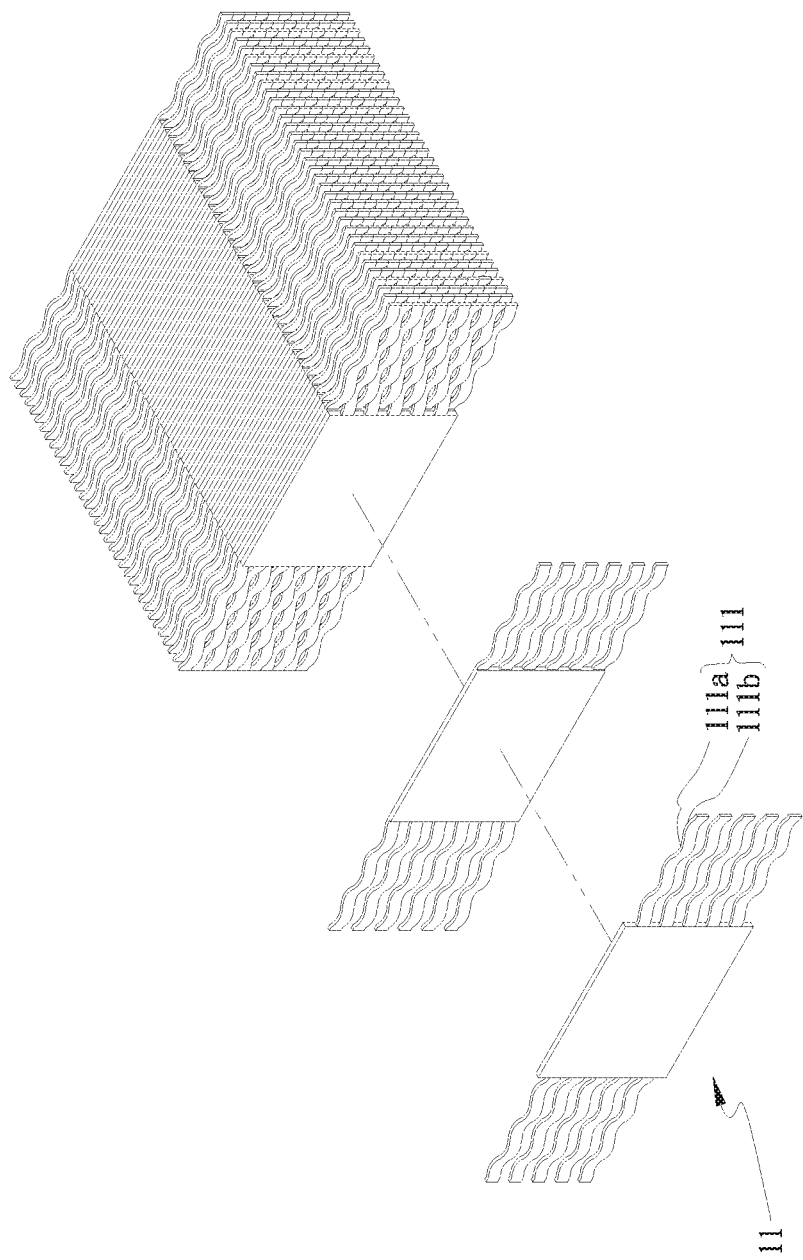
FIG. 5 is an exploded perspective view of the heat radiation fin structure according to a third embodiment of the present invention.
Figure 6:
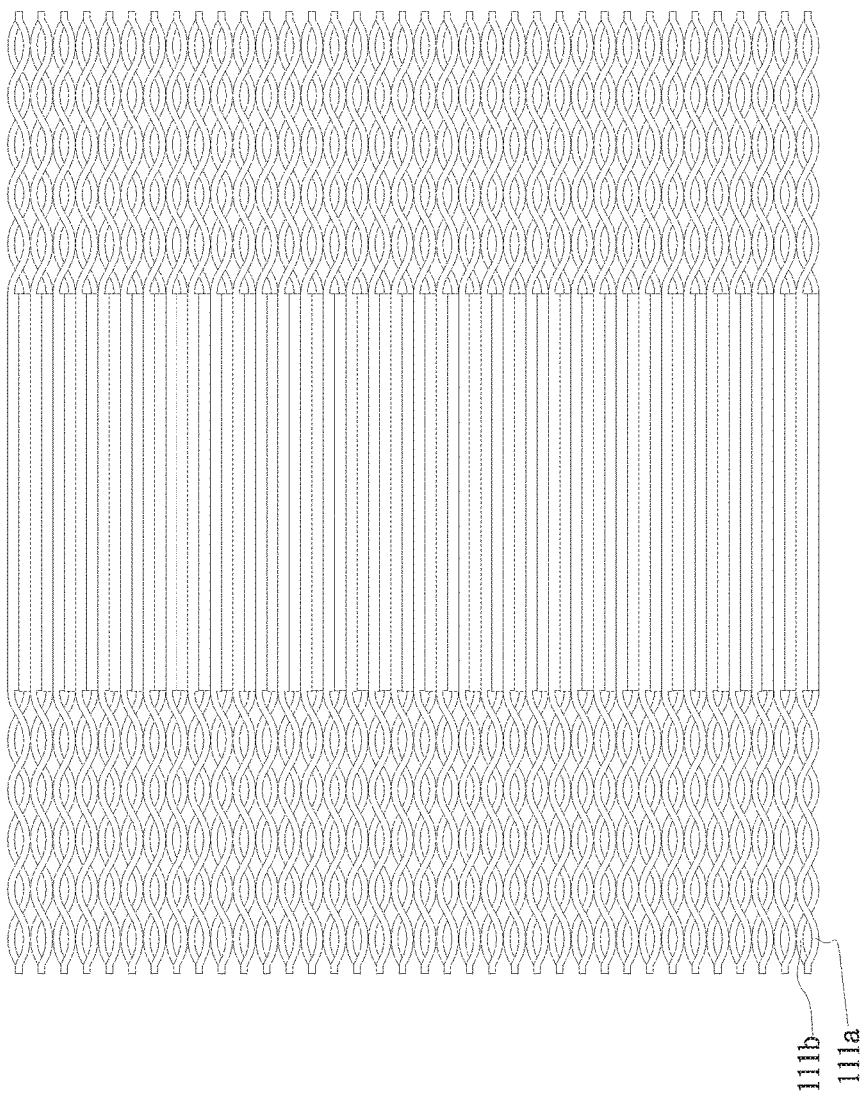
FIG. 6 is an assembled sectional view of the heat radiation fin structure according to the third embodiment of the present invention.
Figure 7:
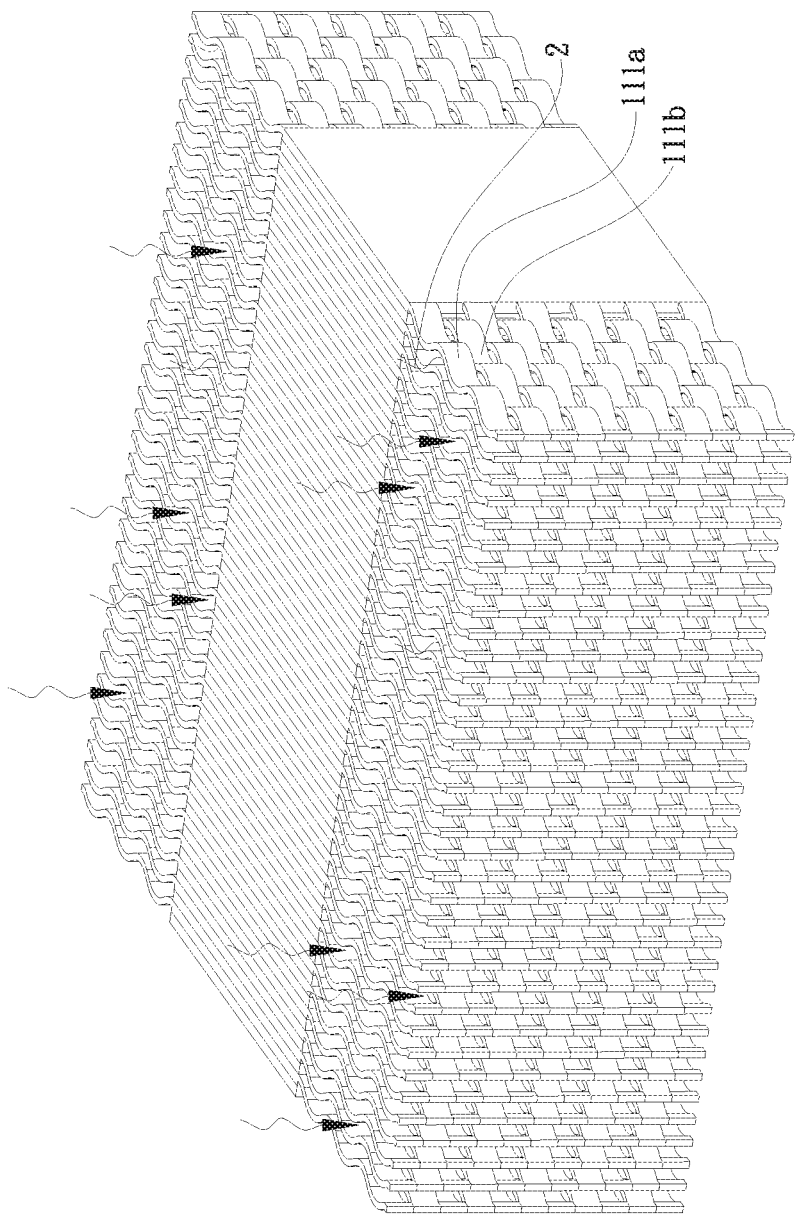
FIG. 7 is an assembled perspective view of the heat radiation fin structure according to the third embodiment of the present invention.

Please refer to FIGS. 5 and 7, which are exploded and assembled perspective views, respectively, of the heat radiation fin structure according to a third embodiment of the present invention, and FIG. 6, which is an assembled sectional view of the heat radiation fin structure according to the third embodiment of the present invention. The third embodiment of the heat radiation fin structure is generally structurally similar to the first embodiment except that, in this third embodiment, the extended portions 111 of the laminations are wavy shaped, and each the lamination has a plurality of tip and foot ends 111a, 111b. Two adjacent laminations 11 are stacked, such that the top ends 11a of the extended portions 111 are located corresponding to the foot ends 111b of the extended portions 111, enabling the cooling air flow to blow through the heat radiation fins and generate the vortex flow, so as to have enhanced heat dissipation efficiency.

Figure 8:
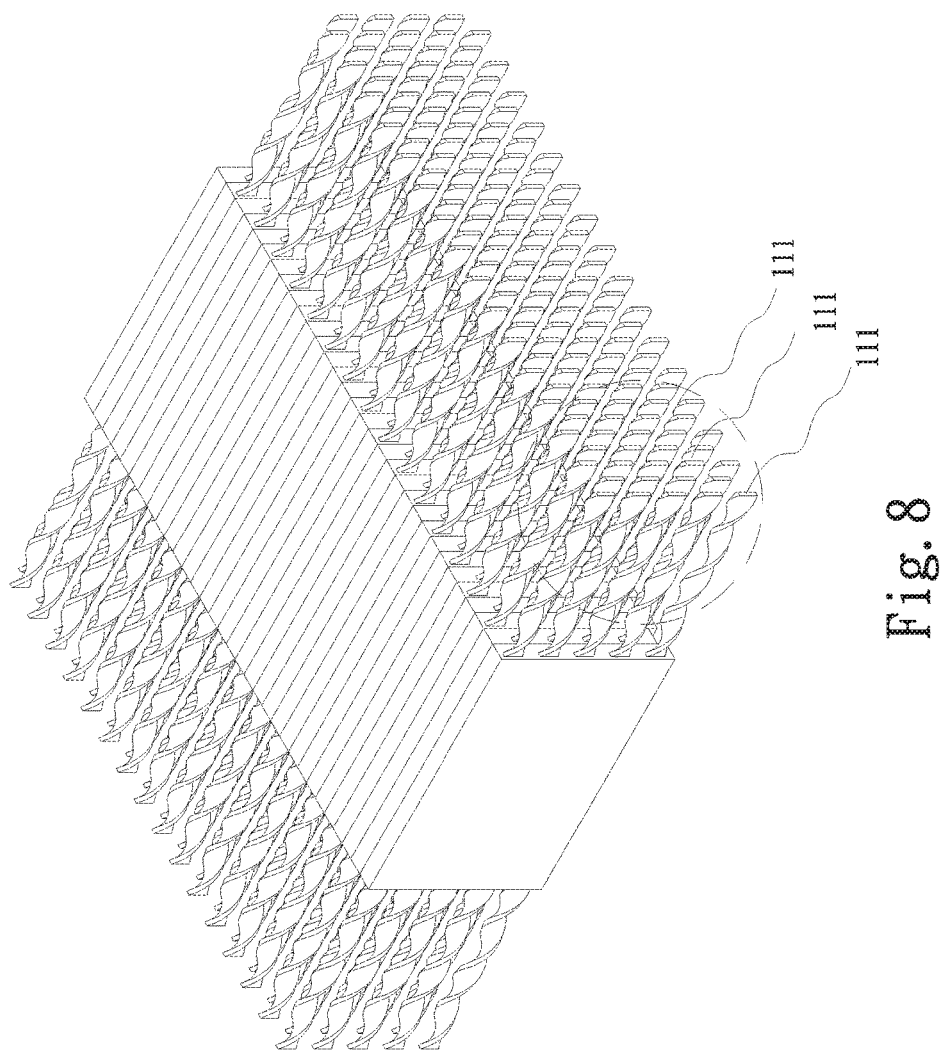
FIG. 8 is an assembled perspective view of the heat radiation fin structure according to a fourth embodiment of the present invention.
Figure 9:
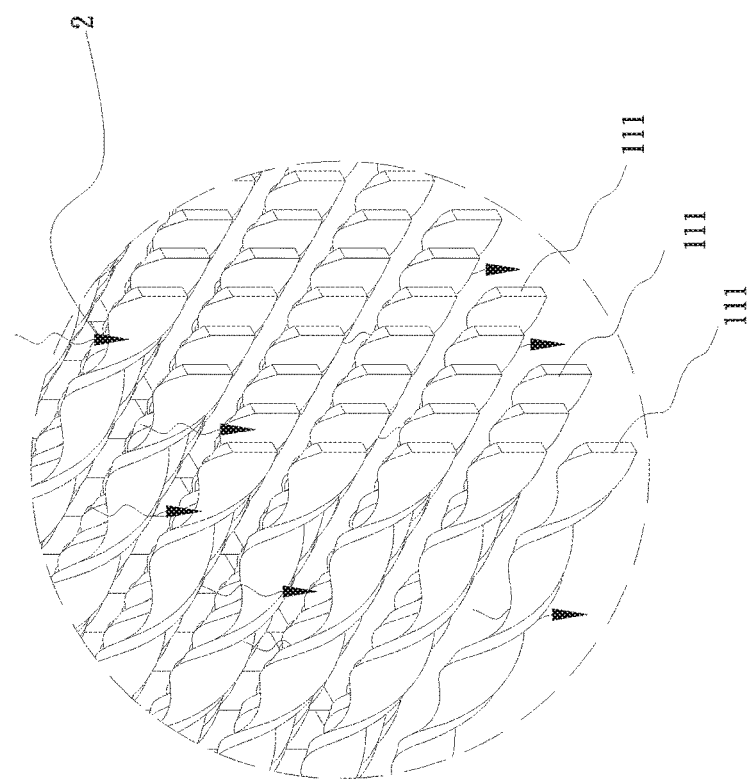
FIG. 9 is a partially enlarged view of the circled area in FIG. 8.

Please refer to FIGS. 8 and 9, which are exploded and assembled perspective views, respectively, of the heat radiation fin structure according to a fourth embodiment of the present invention. The fourth embodiment of the heat radiation fin structure is generally structurally similar to the first embodiment except that, in this fourth embodiment, the extended portions 111 of the laminations 11 are spirally extended, such that the heat radiation fin structure can generate a vortex flow when the cooling air flow 2 is blown through the heat radiation fins, so as to greatly improve heat dissipation efficiency.

With the multiple arrangements and combination sequences of the heat radiation fins, the main body 1 has several kinds of combinations of a plurality of stacked laminations 11. Also, the extended portions 111 of the laminations 11 are extended and stacked in several different ways to form a complicated heat radiation fin structure. When the heat radiation fin structure is used with a cooling fan, the cooling air flow 2 is directed into the passage 112 of the extended portions 111 of the heat radiation fins and forcedly generated the vortex flow, so as to greatly improve heat dissipation efficiency of the heat radiation fin structure.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat radiation fin structure, comprising a main body composed of a plurality of stacked laminations; each lamination having at least one heat dissipation section and at least one heat absorption section comprising a plurality of extended portions each extending radially outwardly from the heat absorption section and curving only clockwise or only counterclockwise and wherein the laminations are stacked in an alternating manner such that the extended portions of adjacent laminations curve only clockwise or only counterclockwise opposite of the adjacent laminations and such that a plurality of passages are formed between the extended portions and wherein the heat dissipation section is connected to the heat absorption section.

* * * * *